United States Patent
Hoffman et al.

(10) Patent No.: US 6,941,312 B1
(45) Date of Patent: Sep. 6, 2005

(54) SIMULTANEOUS MULTIPLE-METHOD (SMM) COMPRESSION

(75) Inventors: William Hoffman, Belle Mead, NJ (US); Michael Anthony Kawecki, Belle Mead, NJ (US); Leonard S. Kelter, Somerset, NJ (US)

(73) Assignee: AT&T Corp., New York, NY (US)

( * ) Notice: Subject to any disclaimer, the term of this patent is extended or adjusted under 35 U.S.C. 154(b) by 819 days.

(21) Appl. No.: 09/949,892

(22) Filed: Sep. 10, 2001

(51) Int. Cl.[7] .............................................. G06F 17/30
(52) U.S. Cl. ...................................... 707/101; 382/240
(58) Field of Search .......................... 707/101; 382/240

(56) References Cited

U.S. PATENT DOCUMENTS

| | | | | |
|---|---|---|---|---|
| 4,955,066 A | * | 9/1990 | Notenboom | 382/240 |
| 5,467,087 A | * | 11/1995 | Chu | 341/51 |
| 5,592,667 A | * | 1/1997 | Bugajski | 707/102 |
| 5,918,225 A | | 6/1999 | White et al. | 707/3 |
| 5,964,842 A | | 10/1999 | Packard | 709/247 |

* cited by examiner

*Primary Examiner*—Wayne Amsbury
(74) *Attorney, Agent, or Firm*—Banner & Witcoff, Ltd.

(57) ABSTRACT

In a method and system for efficient storage and retrieval of data using Simultaneous Multiple-method (SMm) data compression and data decompression the data in a first processing unit is compressed. A SMm data compression unit determines the type of data compression to use for each range of data, constructs and stores a SMm Index Table for the data, and constructs and stores a Compressed Data Table for the data. The SMm Index Table and the Compressed Data Table may be transferred to a second processing unit, where the SMm Index Table is queried using a key element. A type of data compression to be used is retrieved and a determination is made based on the type of data compression used whether data decompression is required. Data from the SMm Index Table is retrieved if data decompression is not required. Data retrieved from the SMm Index Table is interpreted in order to make a decision based on a logical value of the data. Data from the Compressed Data Table is retrieved if data decompression is required and data decompression is performed if required.

28 Claims, 4 Drawing Sheets

US 6,941,312 B1

SIMULTANEOUS MULTIPLE-METHOD (SMM) COMPRESSION

FIELD OF THE INVENTION

The present invention relates generally to data compression and decompression techniques and particularly to simultaneous multiple-method data compression and decompression techniques for efficient storage and retrieval of data in memory and processing constrained systems.

BACKGROUND OF THE INVENTION

The problem presented and used as an exemplary embodiment is that of efficient storage and retrieval of customer identification information and data in a telecommunication network. Specifically, it became obvious that it was necessary to move the call denial function from its platform to a smaller, less expensive platform. The platform that has been and is now in use has a very large memory and call processing capacities and supports multiple services and does not require the use of such efficiencies to conserve memory and processing power. The ongoing maintenance and development costs for accessing the current platform have become prohibitive to smaller services such as a telecommunication service provider's Pay Per Call service such as AT&T's MultiQuest® 900. The relatively small traffic volumes do not justify multi-million dollar development efforts or multi-million dollar platforms.

Moving the call denial function to a smaller, less expensive platform implies that the network elements are constrained in both memory and processing power and, therefore, data storage and retrieval need to be significantly more efficient. It has been estimated that a savings of approximately $5M to $18M can be realized by moving the call denial features into the network service processors as opposed to developing access to the current platform. However, the current service processors (smaller platforms) are constrained by both memory and call processing limitations.

SUMMARY OF THE INVENTION

The present invention is a data compression and decompression method for storing and retrieving customer identification data (Automatic Number Identification (ANI), IP addresses or other data) for purposes of applying logic decisions in a network service processor. This method is especially effective on data where a decision is to be made on the presence or absence of widely distributed customer identification data.

An example of this is network call denial for ANIs that are known to have poor payment history. When the number appears in the service processor's database, then the call processing logic would block the call from accessing the network.

The nature of "bad ANI" type of data is that the customer identification data is widely distributed within the Numbering Plan Area (NPA)–NXX ranges. The Simultaneous Multiple-Method compression method exploits this distribution to make it possible to store large quantities of ANIs in a network element while minimizing processing time for decompressing the stored data.

The present invention could be used generally for processing data in memory and/or processing constrained systems, such as small processors that might be used by security systems to register people as "home" or "not home" or telecommunication systems. These systems process prepaid calling card call denial functions or any other data having an element used for decision-making that has a value that is either a logical value of "true" or "false" or, in the alternative, "yes" or "no" or "zero" or "one".

The present invention as described herein uses multiple methods of data compression simultaneously. This makes the methods for compression and decompression described herein particularly suitable for query systems in which the data compression would be performed in a processing element and the query and data decompression would be performed in a different processing element. While the data compression and decompression methods described herein are particularly suitable to the use of different processing elements to perform the data compression and the query and data decompression functions, it is not necessary that different processing elements be used.

The query and decompression methods presented herein use a multiple-level query. The first level may yield a data compression type that indicates no further data decompression is necessary. A second or higher-level query is only initiated if the first or low-level query yields a data type that requires data decompression. The second or higher level query is used to determine the type of data decompression to be used on the data. Two tables are used to provide processing efficiencies as described in further detain reamin.

The data compression, query and data decompression methods described herein can be used in any application where bit mapped data contains large gaps, sections or areas of logical "ones" or logical "zeroes", that is, where the key element is widely distributed. The methods can be used in network applications or any applications where a decision can be made based directly on the results of a query or based on some calculation that results in the decompression of data that has a logical value. The methods described herein are also particularly useful in data and circuit-switched networks where normal data compression techniques would cause significant processing delays and therefore cause significant customer dissatisfaction.

Other potential applications for the methods described herein are storing Local Calling Area Data in network elements, identifying selected inter-exchange information, Voice Over IP (VOIP) compression schemes and video compression schemes for local customers.

The estimated compression ratios based on current data available from AT&T's ANI database are between 4.7:1 and 10:1, where 4:7 is worst case and 10:1 is a practical best case. These estimates are representative of 4 million blocked ANIs out of 200 million possible ANIs. Four million non-compressed ANIs would require 80 megabytes of main memory for storage. The worst case using SMm compression requires only 17 megabytes. This algorithm could become a standard compression method used for network applications because it reduces the decompression processing overhead and storage by choosing the best method for compression during the Construct process or step described herein.

An object, therefore, of the present invention is to provide efficient storage and retrieval of customer identification data within a memory and processing constrained network element.

Yet another object of the present invention is to, for example, efficiently store large numbers of ANIs or IP addresses within a network element, reducing memory utilization requirements. As indicated above, the storage of ANIs or IP addresses is an exemplary embodiment and the methods described herein could be used for storage of data that uses another element for making a decision that is logically "zero" or "one".

Another object of the present invention is to efficiently retrieve the customer data with least possible impact on processing time, specifically minimizing Post Dial Delay (PDD).

BRIEF DESCRIPTION OF THE DRAWINGS

The invention is best described with reference to the detailed description and the following figures, where.

DETAILED DESCRIPTION OF THE PREFERRED EMBODIMENTS

Figure 1:
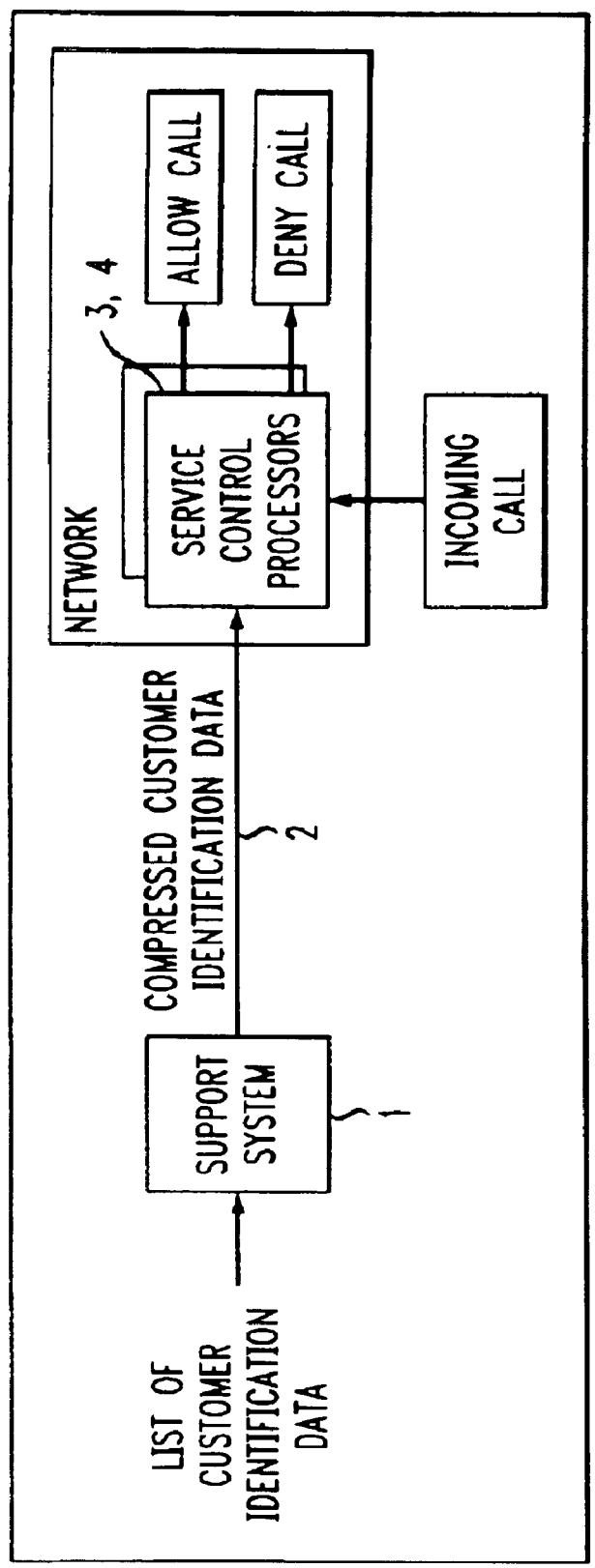
FIG. 1 depicts the overall process of the present invention described herein.

Two tables are used to represent the compressed data examples using the present invention's method. The first table is called a SMm Index Table and the second table is called the Compressed Data Table.

The SMm Index Table (depicted in Table 1) identifies one of four data characteristic for the range of customer identification data, where customer identification data can actually be any data that is a key element in the database. Such key elements are the "Begin Range", "Value", "length" and "Row ID". A characteristic data type for a range of data also indicates the type of data compression to be used. A key element is the query process—that is, an element that is used to locate one or more records of data or the lack of any records of data. The example presented herein is exemplary only and is directed towards an embodiment for allowing or denying customers to place a call. For types 1 and 3, the row also contains a pointer or Row ID in the Compressed Data Table. Using multiple compression methods of the present invention provides both high compression ratios and simultaneously minimizes processing expense.

TABLE 1

SMm Index Table

| Begin Range | Type | Length | Value | Row ID |
|---|---|---|---|---|
| 732-805-2502 | 0 | 0 | 0 | 0 |
| 732-805-9871 | 1 | 0 | 0 | 257 |
| 732-924-6100 | 2 | 1 | 1 | 0 |
| 801-236-2500 | 3 | 0 | 0 | 258 |
| . . . | | | | |

Type 0 identifies in the above Table very large sequences of 0's under Begin Range field 732-805-25-2 and continuing until the range in the next row, which sequences of 0's are indicative of call denial. Type 1 points to a Row ID, 257, found in the Compressed Data Table (depicted in Table 2) that identifies a Run Length Encoding (RLE) compression for more widely distributed customer identification data. Type 2 identifies relatively short lists of customer identification data of the same Value, up to the maximum column length of the row (used when RLE encoding is inefficient).

Type 3 points again to a Row ID, 258, found in the Compressed Data Table (depicted in Table 2) that identifies large quantities of densely packed sequences shown as "bits" (where RLE would not be an efficient compression method). Note that types 0 and 2 will yield the best processing performance since only the SMm Index Table needs to be accessed to determine the state of the customer identification data and not the compression Data Table (depicted in Table 2). Hence, no decompression is necessary.

The Compressed Data Table (depicted in Table 2) contains the rows of compressed data. In the example presented herein, row 257 is defined in the SMm Index Table as a Type 1 or RLE format compression. Each Field represents a Length-Value pair. For example, the first number represented by this row is blocked based on a length-value indicator of 1—1, the next 75 are not blocked based on a length-value indicator of 75-0, the next two are blocked (based on a length-value indicator of 2-1), the next 9000 are not blocked (based on a length-value indicator of 9000-0) and so on. To decipher which ANIs are blocked in this row, 257, begin by using the value in the Begin Range key element field (as defined in the SMm Index Table (depicted in Table 1) for this row, 732-805-9871) then apply the lengths found in Field 2 of the Compression Data Table (depicted in Table 2) as offsets. Therefore, ANIs 732-805-9871, 732-805-9947 and 732-805-9948 will be blocked based on position dependent information.

Row 258 is defined in the SMm Index Table (depicted in Table 1) as a Type 3 or pure position-dependent bit map. Each Field contains up to "word-size" bits (in the example presented herein the word size is 16 bits) that are interpreted as position dependent bit maps. For example, if Field 1 contains "1010 1100 0000 0001" then the following ANIs would be blocked: 801-236-2500, 801-236-2502, 801-236-2504, 801-236-2505, 801-236-2515. To use the bit map "1010 1100 0000 0001" the leftmost bit is bit 0 and taking the Begin Range key element field, a "1" in the bit map indicates that the call will be denied for that ANI and a "0" indicates that the call will be permitted for that ANI. Thus, the call will be denied/blocked for the first ANI in the Begin Range key element field (801-236-2500), calls will be permitted for 801-236-2501, calls will be denied/blocked for 801-236-2502, call will be allowed for 801-236-2503, etc.

TABLE 2

Compressed Data Table

| Row | Field1 | Field2 | Field3 | Field4 | . . . | Field 100 |
|---|---|---|---|---|---|---|
| 257 | 1-1 | 75-0 | 2-1 | 9000-0 | | 1-1 |
| 258 | Bits | Bits | Bits | Bits | . . . | Bits |

All of the compression work is performed before any data is sent to the network service control processor. That is, data compression is performed before the data is transmitted or used for any other purpose. This function (data compression) is usually performed in a network support system that has the ability to communicate with the network element. If the compressed data is to be used or processed by the same network element or unit that compressed the data, then the transmit step would not be necessary. Note that the complete compression/decompression method is a four-step process if the compressed data is to be used by another network or processing element. The four-step compression/decompression method comprises the following steps as depicted in FIG. 1, where the steps are performed in the processing elements indicated in FIG. 1:

Step 1. Construct—Construct and store the content of the SMm Index Table and the compressed customer identification data (or any key element) in the support system. The construct process determines which data type is best suited for a range of customer identification data (key element data).

Step 2. Transmit—The transmit process sends both the content of the SMm Index Table and the Compressed (customer identification (key element)) Data Table to the network element.

Step 3. Query—Upon receipt of a call (query), the network element queries the SMm Index Table using the customer identification data (key element) received on the call (query). Logic in the network element determines if a secondary query is necessary (data types 1 and 3 will require secondary queries and decompression because use of a second table—the Data Compression Table (depicted in Table 2).

Step 4. Decompress—When a secondary query is performed, the network element begins the decompression process and maps the customer identification data from the call (query) to the decompressed information from the Compressed Data Table.

The construct method or Step 1 above may be performed in a system external to the network, typically a network support system. The following steps and flow chart (depicted in FIG. 2) show how the construct process of Step 1 in FIG. 1 creates the SMm Index and Compressed Data Tables and which compression technique to use.

Figure 2:
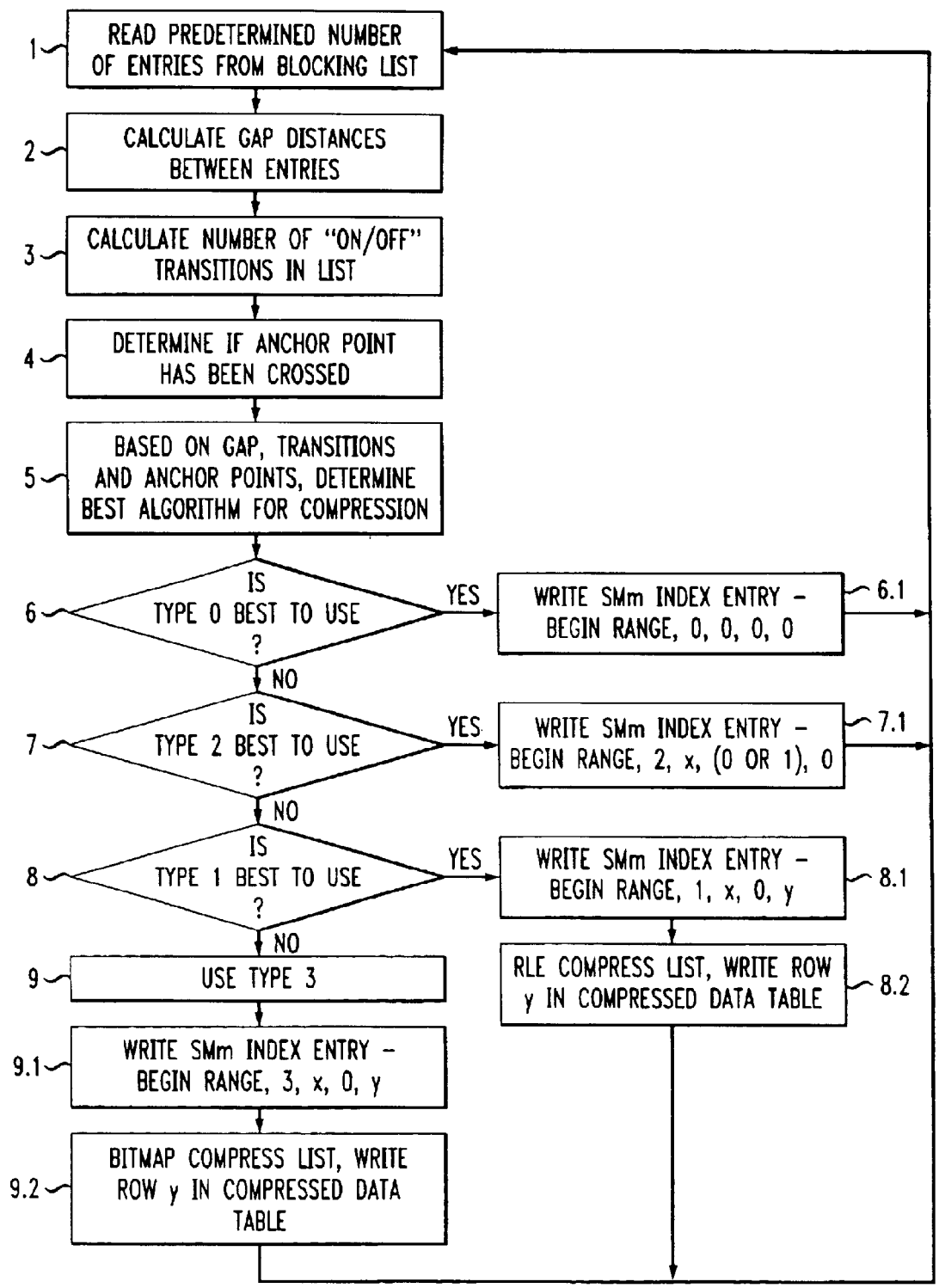
FIG. 2 is a flowchart of the process of the present invention used in the construction of the tables representing the compression process.

The construct Step 1 after receiving a list of customer identification data is further broken down into sub-steps as follows and as depicted in FIG. 2:

Step 1) Read a predetermined number of entries from the input list (in the example present herein, the input list is a blocking list which is the phone numbers from which calls will be denied).

Step 2) Calculate gap distances between entries, where the gap distances in the exemplary embodiment are the size of the range.

Step 3) Calculate the number of on/off transitions in the list, where the on/off transitions in the exemplary embodiment indicate the phone calls that will be denied and those phone calls that will be allowed.

Step 4) Determine if anchor point has been reached. Note that the term "anchor point" refers to a hard-coded, fixed ANI (or other customer information or key element information) that is selected to help optimize coding in the network element. For example, a logical anchor point might be the first digit of the NPA. This would eliminate the need for special processing requiring 10 digit subtraction (a limitation of the network element).

Step 5) Determine the best compression algorithm based on gaps, transitions and anchor points. Note that a comparison may be done by using statistical methods or simply by performing each compression, then checking the number of key elements compressed or the compression size to make the determination.

Step 6) If Type 0 is the best algorithm to be used, then continue to step 6.1. Otherwise continue at step 7.

Step 6.1) Create an entry in the SMm Index Table using the Begin Range key element, Type=0, Length=0, Value=0 and Row ID=0. Continue at step 1 until list is exhausted.

Step 7) If Type 2 is best, then continue at step 7.1. Otherwise, continue at step 8.

Step 7.1) Create an entry in the SMm Index Table using the Begin Range key element, Type=2, Length= "number of similar values", where Value=(0 or 1), Row ID=0. Continue at step 1 until list is exhausted. Note that Type 0 records may also be written as part of this step 7.1.

Step 8) If TYPE 1 is best then continue at step 8.1. Otherwise continue at step 9.

Step 8.1) Create an entry in the SMm Index table using the Begin Range key element, Type=1, Length= "number of key elements having the same value", where Value=0, Row ID="current value of row counter". Note that Type 0 records may also be written as part of this step (Step 8.1).

Step 8.2) Compress list using RLE compression and create an entry in the Compressed Data Table using Row ID as the index value. Continue at step 1 until list is exhausted.

Step 9) Type 3 is best—continue at step 9.1.

Step 9.1) Create an entry in the SMm Index table using the Begin Range key element, Type=3, Length= "number of key element values", Value=0, Row ID="current value of row counter." Note that Type 0 records may also be written as part of this step.

Step 9.2) Compress list using bit mapping and create an entry in the Compressed Data Table using Row ID as the index value. Continue at step 1 until list is exhausted.

The support system shown in FIG. 1 formulates the commands necessary to build and update the tables in the network element. These commands are derived from the stored compressed data in the construct process. The transmit process forwards the content of SMm Index Table (depicted in Table 1) and the Compressed Data Table (depicted in Table 2) to the network element for processing, e.g., to await queries.

The query process or method of the present invention is initiated when a query is made to the compressed database. Using a call denial system as an example, upon receipt of a call, the network element queries the SMm Index Table 1 using the customer identification data received on the call. Logic in the query process (described below in FIG. 3) determines if a secondary query is necessary (data types 1 and 3 will require secondary queries and decompression). The customer identification data used in the above example, would, in general, be a key element of the database.

Figure 3:
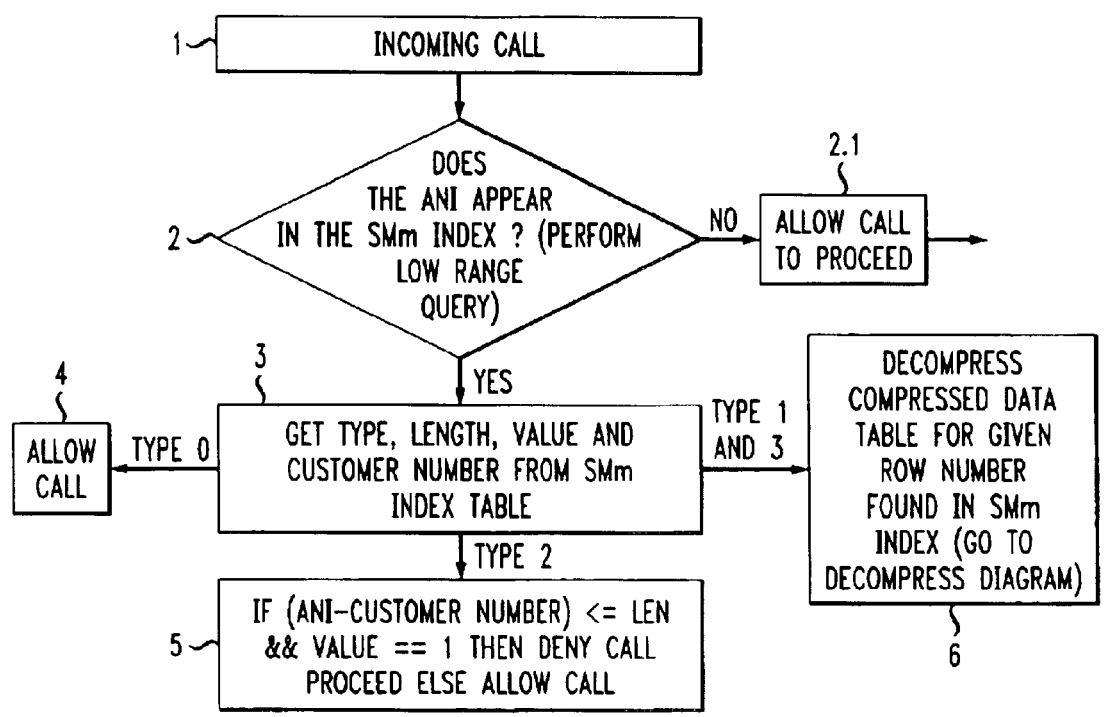
FIG. 3 is a flowchart of the query process of the present invention.

The query method steps are depicted in FIG. 3. The example provided herein is directed towards a call processing system using a database to allow or deny calls. The compression/decompression methods presented herein are equally applicable to any database where there are large sections or areas of common values in a field or element value of the database and that field or element is used to make decisions. Other fields or elements could be defined other than those used here (Type, Value, Length, Row ID).

Step 1) A call (query) enters the service processor that contains customer informational data (in this case the ANI).

Step 2) The service processor performs a "Low Range Query" on the SMm Index Table 1 using the key element (ANI here). If the query does not find the key element (ANI) in the Begin Range field, then the call is allowed to proceed as shown in Step 2.1. In general, a query response would be returned indicating that the key element did not locate any records having the key element that was the basis of the query. Otherwise, continue at step 3. A Low Range Query in the example presented herein matches the row with the HIGHEST key value that is less than or equal to the query value.

Step 3) When the match is found in the SMm Index Table 2, the Begin Range, Type, Value, Length, and Row ID are retrieved from the SMm Index Table 2, where Begin Range, Type, Value, Length and Row ID are fields or elements of a record of the database and Type indicates the data compression type.

Step 4) If the Type=0, then the call is allowed to proceed. In general, a query response would use the field or element retrieved as a basis for a decision.

Step 5) If the Type=2 then a calculation is performed to determine if the ANI should be allowed or blocked. The ANI is blocked if the ANI−Cust#<=Length and the Value=1 in the example presented herein. Any other calculation could be the basis of the decision process.

Step 6) If the Type=1 or 3, then decompression is necessary (continue to decompression process).

Figure 4:
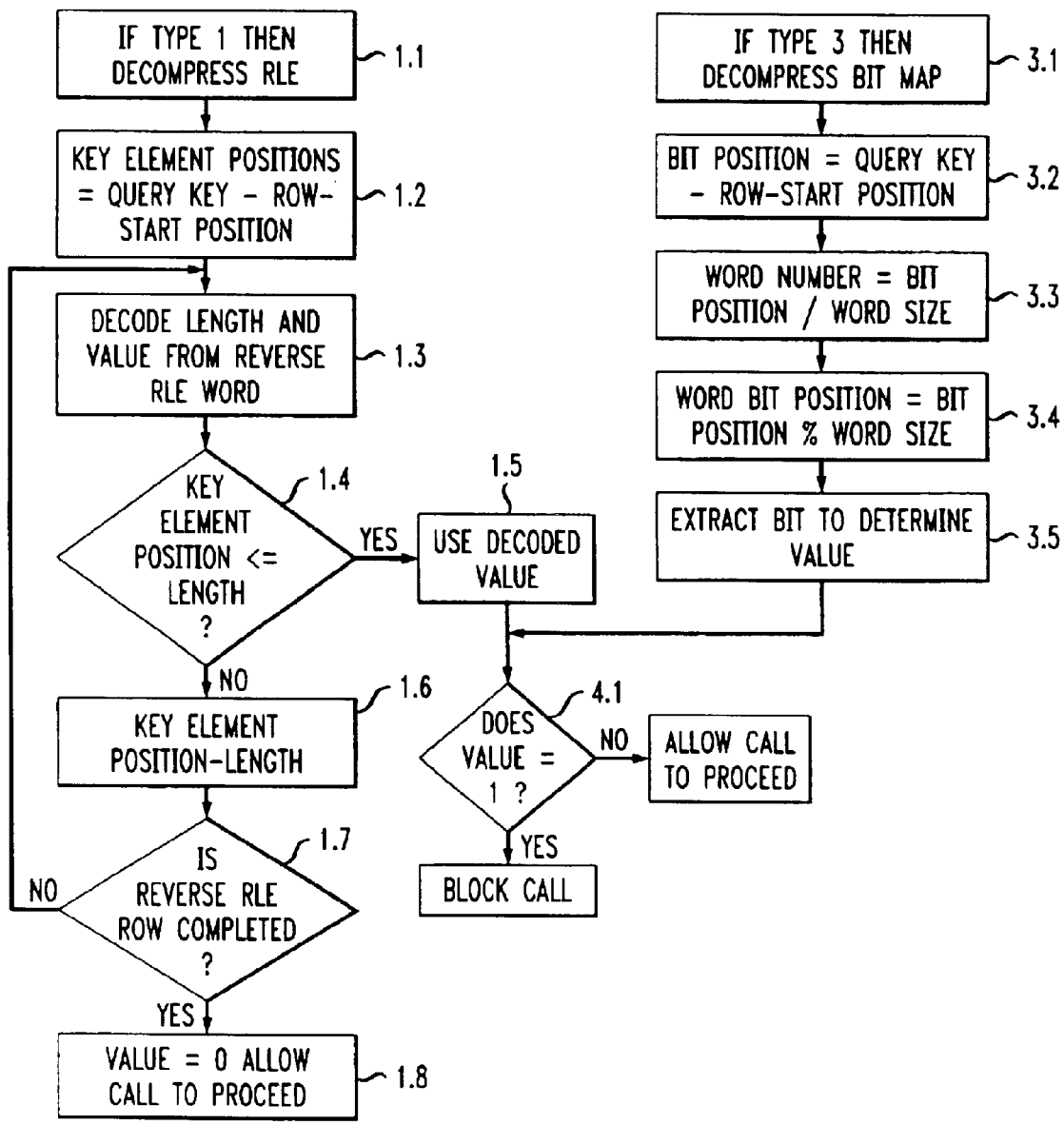
FIG. 4 is a flowchart of the decompression of the data using the tables constructed during the data compression procession process of the present invention.

The decompression process or method steps are depicted in FIG. 4. When a secondary query is performed, the network element in the present example begins the decompression process and maps the key element (customer identification data in the present example) to the decompressed customer information (in general, key element) in the Compressed Data Table 2.

If RLE (Type=1), then go to step 1.1
If Bit Map (Type=3), then go to step 3.1
Step 1.1. Decompress RLE format.
Step 1.2. Find the key element position by subtracting the row-start position from the query key (ANI in this case).
Step 1.3. Decode the Length & Value from reverse RLE word.
Step 1.4. If the key element Position is <=Length, then go to step 1.5. If not, go to step 1.6.
Step 1.5. Retain the decoded bit value and go to step 4.1 described later.
Step 1.6. Subtract the Length from key element position.
Step 1.7. If RLE is not complete, then continue at step 1.3. Otherwise continue at step 1.8.
Step 1.8. the value is 0, allow call to proceed. In general, make a decision based on the results of the calculation based on the field or element values retrieved, where the field or element values retrieved are based on the key element that was the subject of the query.
Step 3.1. If Type 3, then decompress Bit Map.
Step 3.2. Find the bit position by subtracting the row-start position from the query key (ANI in this case).

Bit Position=query key−row-start position

Step 3.3. Calculate the Word Number.

Word number=Bit position/word size

Step 3.4. Calculate the Word Bit Position using the modulus of the word size.

Word bit position=Bit position % word size

Step 3.5. Extract bit to determine value. Retain value and continue at step 4.1.
Step 4.1. If the decoded bit is a 1, then block the call; otherwise, allow the all to proceed. In general, make a decision based on the results of the calculation based on the field or element values retrieved, where the field or element values retrieved are based on the key element that was the subject of the query.

While the present invention is described in terms of network elements and processing units, any processing unit such as ASICs, FPGAs or RISC processors or any combination thereof may be effectively substituted for any processing unit or network element.

It should be clear from the foregoing that the objectives of the invention have been met. While particular embodiments of the present invention have been described and illustrated, it should be noted that the invention is not limited thereto since modifications may be made by persons skilled in the art. The present application contemplates any and all modifications within the spirit and scope of the underlying invention disclosed and claimed herein.

What we claim is:

1. A method for efficient storage and retrieval of data using Simultaneous Multiple-method (SMm) data compression and data decompression comprising the steps of:
   compressing said data in a first processing unit using SMm data compression comprising the substeps of:
      determining a type of data compression to use for each range of data;
      constructing and storing a SMm Index Table for said data; and
      constructing and storing a Compressed Data Table for said data;
   optionally transferring said SMm Index Table and said Compressed Data Table to a second processing unit;
   querying said SMm Index Table using a key element specified in said query;
   retrieving said type of data compression used;
   determining based on said type of data compression used whether data decompression is required;
   retrieving data from said SMm Index Table if data decompression is not required;
   interpreting said data retrieved from said SMm Index Table in order to make a decision based on a logical value of said data;
   retrieving data from said Compressed Data Table if data decompression is required; and
   performing data decompression if required.

2. The method according to claim 1, wherein said SMm data compression and data decompression is used in memory and processing constrained systems.

3. The method according to claim 1, wherein said compressing step further comprises the steps of:
   reading a predetermined number of entries from an input list of data records;
   calculating gap distances between entries;
   calculating a number of on and off transitions in the input list;
   determining if an anchor point has been selected; and
   determining a data compression algorithm based on said gap distances, said on and off transitions and said anchor points.

4. The method according to claim 3, wherein said step of constructing and storing said SMm Index Table is based on a data compression algorithm selected.

5. The method according to claim 3, wherein said step of constructing and storing said Compressed Data Table is performed when said data requires compression.

6. The method according to claim 5, wherein said data is compressed using Run length Encoding.

7. The method according to claim 5, wherein said data is compressed using bit mapping.

8. The method according to claim 1, wherein said querying step further comprises the substep of performing a low-range query on the SMm Index Table in order to retrieve all elements of a data record matching said key element used as an index for said low-range query.

9. The method according to claim 8, wherein said second retrieving step further comprises the substep of performing a higher level query on said Compressed Data Table using said elements retrieved in said low-range query directly as an index into said Compressed Data Table.

10. The method according to claim 8, wherein said second retrieving step further comprises the substep of performing a higher level query on said Compressed Data Table using said elements retrieved in said low-range query to calculate an index into said Compressed Data Table.

11. The method according to claim 9, wherein said performing data decompression step further comprises the substep of decoding said data using a reverse Run Length Encoding algorithm.

12. The method according to claim 9, wherein said performing data decompression step further comprises the substep of decoding said data using a bit map decoding algorithm.

13. The method according to claim 11, wherein said performing data decompression step further comprises the steps of:
    calculating a key element position;
    decoding length and value from a reverse Run Length Encoding data word retrieved by said higher level query:
    comparing said key element position to said length;
    subtracting said length from said key element position;
    determining if said reverse Run Length Encoding algorithm is complete for a retrieved range of compressed data;
    repeating said decoding step, said comparing step, said subtracting step and said determining step until said reverse Run Length Encoding algorithm is complete; and
    testing a decoded value to determine a logical value on which to base a decision.

14. The method according to claim 12, wherein said bit map decoding algorithm further comprises the steps of:
    calculating a location from which to retrieve a data element; and
    extracting and testing said data element to determine a logical value on which to base a decision.

15. A system for efficient storage and retrieval of data using Simultaneous Multiple-method (SMm) data compression and data decompression comprising:
    means for compressing said data in a first processing unit using SMm data compression comprising:
        means for determining the type of data compression to use for each range of data;
        means for constructing and storing a SMm Index Table for said data; and
        means for constructing and storing a Compressed Data Table for said data;
    means for optionally transferring said SMm Index Table and said Compressed Data Table to a second processing unit;
    means for querying said SMm Index Table using a key element specified in said query;
    means for retrieving a type of data compression used;
    means for determining based on said type of data compression used whether data decompression is required;
    means for retrieving data from said SMm Index Table if data decompression is not required;
    means for interpreting said data retrieved from said SMm Index Table in order to make a decision based on a logical value of said data;
    means for retrieving data from said Compressed Data Table if data decompression is required; and
    means for performing data decompression if required.

16. The system according to claim 15, wherein said SMm data compression and data decompression is used in memory and processing constrained systems.

17. The system according to claim 15, wherein said means for compressing further comprises:
    means for reading a predetermined number of entries from an input list of data records;
    means for calculating gap distances between entries;
    means for calculating a number of on and off transitions in the input list;
    means for determining if an anchor point has been selected; and
    means for determining a data compression algorithm based on gap distances, on and off transitions and anchor points.

18. The system according to claim 17, wherein said means for constructing said SMm Index Table is based on the data compression algorithm selected.

19. The system according to claim 17, wherein said means for constructing said Compressed Data Table is performed when said data requires compression.

20. The system according to claim 19, wherein said data is compressed using Run Length Encoding.

21. The system according to claim 19, wherein said data is compressed using bit mapping.

22. The system according to claim 15, wherein said means for querying further comprises means for performing a low-range query on the SMm Index Table in order to retrieve all elements of a data record matching said key element used as an index for said low-range query.

23. The system according to claim 22, wherein said second means for retrieving further comprises means for performing a higher level query on said Compressed Data Table using said elements retrieved in said low-range query directly as an index into said Compressed Data Table.

24. The system according to claim 22, wherein said second means for retrieving further comprises means for performing a higher level query on said Compressed Data Table using said elements retrieved in said low range query to calculate an index into said Compressed Data Table.

25. The system according to claim 23, wherein said means for performing data decompression further comprises means for decoding said data using a reverse Run Length Encoding algorithm.

26. The system according to claim 23, wherein said means for performing data decompression further comprises means for decoding said data using a bit map decoding algorithm.

27. The system according to claim 25, wherein said means for performing data decompression further comprises:
    means for calculating a key element position;
    means for decoding length and value from a reverse Run Length Encoding data word retrieved by said higher level query:
    means for comparing said key element position to said length;

means for subtracting said length from said key element position;

means for determining if said reverse Run Length Encoding algorithm is complete for a retrieved range of compressed data;

means for looping through said means for decoding, said means for comparing, said means for subtracting and said means for determining until said reverse Run Length Encoding algorithm is complete; and means for testing a decoded value to determine a logical value on which to base a decision.

28. The system according to claim 15, wherein said bit map decoding algorithm further comprises:

means for calculating a location from which to retrieve a data element; and means for extracting and testing said data element to determine a logical value on which to base a decision.

* * * * *